United States Patent
Takano et al.

(10) Patent No.: US 9,274,415 B2
(45) Date of Patent: Mar. 1, 2016

(54) PHOTOMASK, PHOTOMASK SET, EXPOSURE APPARATUS AND EXPOSURE METHOD

(71) Applicant: NIPPON MEKTRON, LTD., Tokyo (JP)

(72) Inventors: Shoji Takano, Tokyo (JP); Fumihiko Matsuda, Tokyo (JO); Yoshihiko Narisawa, Tokyo (JP)

(73) Assignee: NIPPON MEKTRON, LTD. (JP)

( * ) Notice: Subject to any disclaimer, the term of this patent is extended or adjusted under 35 U.S.C. 154(b) by 0 days.

(21) Appl. No.: 14/536,978

(22) Filed: Nov. 10, 2014

(65) Prior Publication Data

US 2015/0062550 A1 Mar. 5, 2015

Related U.S. Application Data

(62) Division of application No. 14/015,279, filed on Aug. 30, 2013.

(30) Foreign Application Priority Data

Sep. 13, 2012 (JP) .................. 2012-202022

(51) Int. Cl.
 *G03B 27/32* (2006.01)
 *G03B 27/42* (2006.01)
 *G03F 1/42* (2012.01)
 *G03F 7/20* (2006.01)
 *G03F 9/00* (2006.01)

(52) U.S. Cl.
 CPC .. *G03F 1/42* (2013.01); *G03F 7/20* (2013.01); *G03F 7/70425* (2013.01); *G03F 9/7003* (2013.01); *G03F 9/7084* (2013.01); *G03F 9/7088* (2013.01)

(58) Field of Classification Search
 CPC .......................... G03F 7/7203; G03F 7/70425
 USPC ................. 355/26, 53; 430/5, 20, 30
 See application file for complete search history.

(56) References Cited

U.S. PATENT DOCUMENTS 5,940,528 A * 8/1999 Tanaka et al. ............... 382/151
6,114,072 A * 9/2000 Narimatsu .................... 430/5

(Continued)

FOREIGN PATENT DOCUMENTS

JP 5-41982 B2 6/1993
JP 2007-121425 A 5/2007

(Continued)

*Primary Examiner* — Hung Henry Nguyen
(74) *Attorney, Agent, or Firm* — Cantor Colburn LLP

(57) ABSTRACT

An exposure apparatus may include a first moving mechanism moving by driving a first drive source a first photomask; a second moving mechanism moving by driving a second drive source a second photomask; an imaging means for imaging a first alignment mark formed on the first photomask and a substrate side mark formed on the substrate and imaging a second alignment mark formed on the first photomask and a third alignment mark formed on the second photomask; and a control unit, wherein the control unit controls the first drive source so that alignment between the first alignment mark and the substrate side mark is performed based on results of imaging these marks, and the control unit controls the second drive source so that alignment between the second alignment mark and the third alignment mark is performed based on results of imaging these marks.

2 Claims, 13 Drawing Sheets

(56) References Cited

U.S. PATENT DOCUMENTS 6,151,120 A * 11/2000 Matsumoto et al. .......... 356/399
6,211,942 B1 * 4/2001 Okamoto ........................ 355/26

FOREIGN PATENT DOCUMENTS

| JP | 4218418 | B2 | 11/2008 |
| JP | 4921789 | B2 | 2/2012 |

* cited by examiner

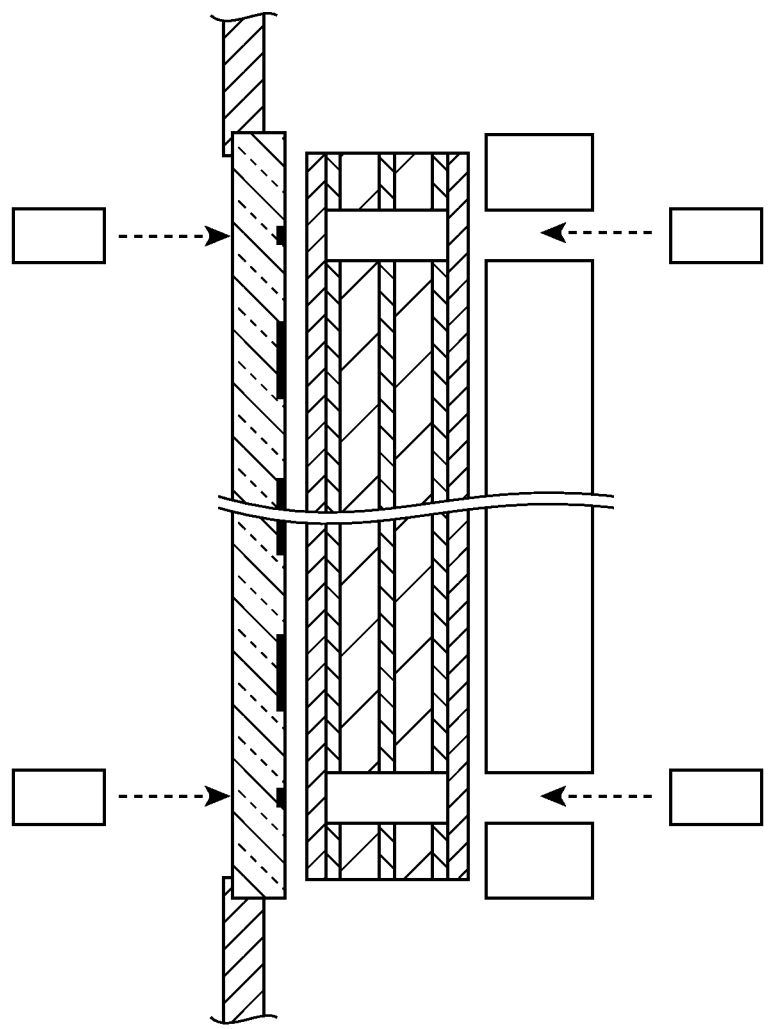
Fig.13
PRIOR ART
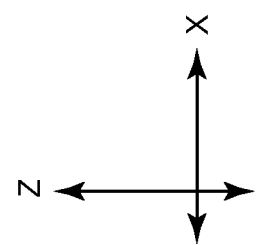

PHOTOMASK, PHOTOMASK SET, EXPOSURE APPARATUS AND EXPOSURE METHOD

CROSS REFERENCE TO RELATED APPLICATIONS

The present application is a divisional application of U.S. patent application No. 14/015,279, filed on Aug. 30, 2013 (presently co-pending), the entire contents of which are incorporated herein by reference. The Ser. No. 14/015,279 application claimed the benefit of the date of the earlier filed Japanese Patent Application No. JP 2012-202022, filed Sep. 13, 2012, priority to which is also claimed herein, and the contents of which are also incorporated by reference herein.

BACKGROUND OF THE INVENTION

1. Field of the Invention

The present invention relates to a photomask, a photomask set, an exposure apparatus, and an exposure method.

2. Description of the Related Art

Regarding flexible printed circuits (hereinafter referred to as circuit boards or substrates) used in electronic devices or the like, demands for densification are increasing along with miniaturization and enhanced functionality of electronic devices. To correspond to such densification, there have been attempts to densify a substrate by forming a multi-layer circuit board in which conductive layers of the substrate are provided on both faces or in three or more layers. As one way of densification, a separate substrate which connects multi-layer printed circuit boards, on which various types of electronic parts are mounted, via a connector or the like is widely used mainly in small electronic apparatuses such as lap-top personal computers, digital cameras, cell phones, game machines, and the like.

Incidentally, when it is attempted to densify a substrate having conductive layers at least on its front and rear faces, that is, having two or more layers, it is important that the positional accuracy of a conductive pattern formed on each layer or each of the front and rear faces is high. Specifically, when the positional accuracy of the conductive pattern on each layer or each of the front and rear faces is high, it is possible to reduce the diameters of lands of inter-layer connection parts, and there is a merit to suppress positional displacement of the conductive patterns on the front and rear faces when a target in the subsequent process is disposed only on one face. In connection with increasing the positional accuracy of such a conductive pattern formed on each layer or each of the front and rear faces, there are technical ideas disclosed in Patent Documents 1 to 4.

FIG. 13 is a cross-sectional view schematically illustrating an exposure method of Patent Document 1. As illustrated in FIG. 13, the method of Patent Document 1 performs alignment by reading with a CCD camera a ring-shaped alignment mark added to a substrate and a circular alignment mark added to a photomask. This method is basically able to perform alignment only on one face at a time.

FIG. 14 is a cross-sectional view schematically illustrating an exposure method of Patent Document 2. As illustrated in FIG. 14, the method of Patent Document 2 provides through holes in a substrate, and provides different alignment marks on each of photomasks of a front side and a rear side. Then, the through holes and the alignment marks of the photomasks of the front side and the rear side are aligned, to thereby align the substrate and the photomasks on the front side and the rear side.

Further, Patent Document 3 discloses a method using vacuum suction for a work retaining means. Moreover, Patent Document 4 discloses a work retaining means of clamping type.

[Patent Document 1] Japanese Patent No. 4921789
[Patent Document 2] Japanese Patent Application Laid-open No. 2007-121425
[Patent Document 3] Japanese Patent No. 4218418
[Patent Document 4] Japanese Examined Patent Application Publication No. H5-41982

Now, in the method disclosed in Patent Document 1, when photosensitive resists formed respectively on both front and rear faces of the substrate are exposed, it is necessary to align each of the front face and the rear face of the substrate with the photomask on the front side. Consequently, positional displacement occurs two times between the ring-shaped alignment mark of the substrate and the circular alignment mark of the photomask, and thus it is difficult to improve alignment accuracy for the front and rear faces of the substrate.

Further, in the method disclosed in Patent Document 2, concavities and convexities exist between a copper foil and a transparent layer (for example, a polyimide film) of the substrate for increasing adhesiveness. Consequently, when the through holes are formed by removing the copper foil of the substrate through rear surface processing, there is a problem that light scatters through the concavities and convexities existing on the transparent layer, and edges of the through holes and edges of the alignment marks existing on the photomasks on the rear side become unclear, which decreases the alignment accuracy. Further, when the through holes are formed by boring the substrate through machining, there is a problem that the alignment accuracy decreases due to occurrence of variation in processing accuracy. Moreover, through the method disclosed in Patent Document 2, the substrate is pulled off a roll winding part to an exposure area, and the substrate is retained with tension at the exposure area. Consequently, there is a concern that the substrate can be stretched, and also it is difficult to improve the alignment accuracy because retention at the exposure area is not stable.

Note that when the work retaining means of Patent Documents 3, 4 are applied to the methods disclosed in Patent Documents 1, 2, it is difficult to improve the alignment accuracy between the photomasks and the substrate.

The present invention is made based on the above-described situation, and an object thereof is to provide a photomask, a photomask set, an exposure apparatus, and an exposure method which are capable of improving the alignment accuracy between a substrate and respective photomasks disposed on the front and rear faces of the substrate.

SUMMARY OF THE INVENTION

To solve the above-described problems, according to one aspect of the present invention, there is provided a photomask having a drawing pattern for exposure formed on one face opposing a substrate, a first alignment mark for alignment with a substrate side mark formed on the substrate, the first alignment mark being provided in a region of the one face, the region opposing the substrate when the substrate is retained and the drawing pattern is not formed in the region, and a second alignment mark for alignment with a third alignment mark provided on another photomask, the second alignment mark being provided in a region which does not oppose the substrate when the substrate is retained.

Further, according to another aspect of the present invention, in the above-described invention of the photomask, preferably, a recessed portion is provided in the one face, and when negative pressure is applied via a pressure generating means, the recessed portion applies the negative pressure to an opposing face of the substrate which opposes the one face.

Furthermore, according to another aspect of the present invention, in the above-described invention of the photomask, preferably, the recessed portion is provided with a suction trench extending along the one face and a suction hole penetrating to the suction trench from another face on an opposite side of the one face.

Further, according to another aspect of the present invention, in the above-described invention of the photomask, preferably, the suction trench is formed in a ring shape, the first alignment mark is provided on an inside surrounded by the ring-shaped suction trench on the one face, and the second alignment mark is provided on an outside of the ring-shaped suction trench on the one face.

Further, according to a second aspect of the present invention, there is provided a photomask set having a first photomask and a second photomask, wherein the first photomask has a drawing pattern for exposure formed on one face opposing a substrate, a first alignment mark for alignment with a substrate side mark formed on the substrate, the first alignment mark being provided in a region of the one face, the region opposing the substrate when the substrate is retained and the drawing pattern is not formed in the region, and a second alignment mark for alignment with a third alignment mark provided on the second photomask, the second alignment mark being provided in a region which does not oppose the substrate when the substrate is retained, and the second photomask has a drawing pattern for exposure formed on one face opposing a substrate, and a third alignment mark for alignment with the second alignment mark provided on the first photomask, the third alignment mark being provided in a region of the one face wherein the region does not oppose the substrate when the substrate is retained.

Further, according to a third aspect of the present invention, there is provided an exposure apparatus for exposing both faces of a substrate wherein both the faces have a photosensitive material formed thereon, the exposure apparatus having a first moving mechanism having a first drive source and moving by driving the first drive source a first photomask disposed to oppose one face of the substrate at a position where exposure is performed, a second moving mechanism having a second drive source and moving by driving the second drive source a second photomask disposed to oppose the one face of the substrate at a position where exposure is performed, an imaging means for imaging a first alignment mark formed on the first photomask and a substrate side mark formed on the substrate and imaging a second alignment mark formed on the first photomask and a third alignment mark formed on the second photomask, and a control unit for controlling driving of the first drive source, the second drive source, and the imaging means, wherein the control unit controls the first drive source so that alignment between the first alignment mark and the substrate side mark is performed based on results of imaging these marks in the imaging means, and the control unit controls the second drive source so that alignment between the second alignment mark and the third alignment mark is performed based on results of imaging these marks in the imaging means.

Further, according to a fourth aspect of the present invention, there is provided an exposure apparatus for exposing both faces of a substrate wherein both the faces have a photosensitive material formed thereon, the exposure apparatus having a first photomask having a drawing pattern for exposure formed on one face, a first alignment mark for alignment with a substrate side mark formed on the substrate, the first alignment mark being provided in a region of the one face, the region opposing the substrate when the substrate is retained and the drawing pattern is not formed in the region, and a second alignment mark provided in a region which does not oppose the substrate when the substrate is retained, a first moving mechanism having a first drive source and moving by driving the first drive source the first photomask disposed to oppose one face of the substrate at a position where exposure is performed, a second photomask having a drawing pattern for exposure formed on one face, a third alignment mark for alignment with the second alignment mark, the third alignment mark being provided in a region of the one face wherein the region does not oppose the substrate when the substrate is retained, a second moving mechanism having a second drive source and moving by driving the second drive source the second photomask disposed to oppose the one face of the substrate at a position where exposure is performed, an imaging means for imaging the first alignment mark and a substrate side mark formed on the substrate and imaging the second alignment mark and the third alignment mark, and a control unit for controlling driving of the first drive source, the second drive source, and the imaging means, wherein the control unit controls the first drive source so that alignment between the first alignment mark and the substrate side mark is performed based on results of imaging these marks in the imaging means, and the control unit controls the second drive source so that alignment between the second alignment mark and the third alignment mark is performed based on results of imaging these marks in the imaging means.

Further, according to another aspect of the present invention, preferably, the above-described invention of the exposure apparatus further has a first pressure generating means for retaining the substrate by the first photomask by utilizing negative pressure or releasing retention of the substrate by the first photomask by utilizing positive pressure, and a second pressure generating means for retaining the substrate by the second photomask by utilizing negative pressure or releasing retention of the substrate by the second photomask by utilizing positive pressure, wherein the control unit controls driving of the first pressure generating means and the second pressure generating means, the control unit controls driving of the first pressure generating means so as to retain the substrate by the first photomask by utilizing negative pressure after alignment between the substrate and the first photomask is performed by controlling the first drive source, and the control unit controls driving of the second pressure generating means so as to retain the substrate by the second photomask by utilizing negative pressure after alignment between the substrate and the second photomask is performed by controlling the second drive source.

Further, according to a fifth aspect of the present invention, there is provided an exposure method for exposing both faces of a substrate wherein both the faces have a photosensitive material formed thereon, the exposure method having a first imaging step of imaging a first alignment mark formed on a first photomask and a substrate side mark formed on the substrate and to be aligned with the first alignment mark, a first alignment step of performing alignment between the first alignment mark and the substrate side mark at a position where exposure is performed based on results of imaging in the first imaging step, a first position retaining step of retaining, after the first alignment step, an aligned state between the first photomask and the substrate at least until the exposure of the substrate is finished, a second imaging step of imaging, after the position retaining step, a second alignment mark formed on the first photomask and a third alignment mark formed on a second photomask and to be aligned with the second alignment mark, a second alignment step of performing alignment between the second alignment mark and the third alignment mark at a position where exposure is performed based on results of imaging in the second imaging step, a second position retaining step of retaining, after the second alignment step, an aligned state between the first photomask and the second photomask at least until the exposure of the substrate is finished, and an exposing step of exposing the substrate after the second position retaining step.

According to the present invention, it is possible to improve alignment accuracy with respective photomasks disposed on the front and rear faces of a substrate.

BRIEF DESCRIPTION OF THE DRAWINGS

FIG. 13 is a cross-sectional view schematically illustrating a conventional exposure method of Patent Document 1.

DETAILED DESCRIPTION OF THE PREFERRED EMBODIMENT

Hereinafter, a photomask 70, a photomask set (set of photomasks 70), is an exposure apparatus 10, and an exposure method according to one embodiment of the present invention will be described based on the drawings. Note that when an XYZ orthogonal coordinate system is set in the following description, in this coordinate system a vertical direction to depart from an installation face where the exposure apparatus 10 is installed is Z direction, a transport direction of a flexible printed circuit P is X direction, and a direction orthogonal to the X direction and the Z direction is Y direction. Further, the XY plane is a horizontal plane.

<Regarding the Flexible Printed Circuit P>

Figure 1:
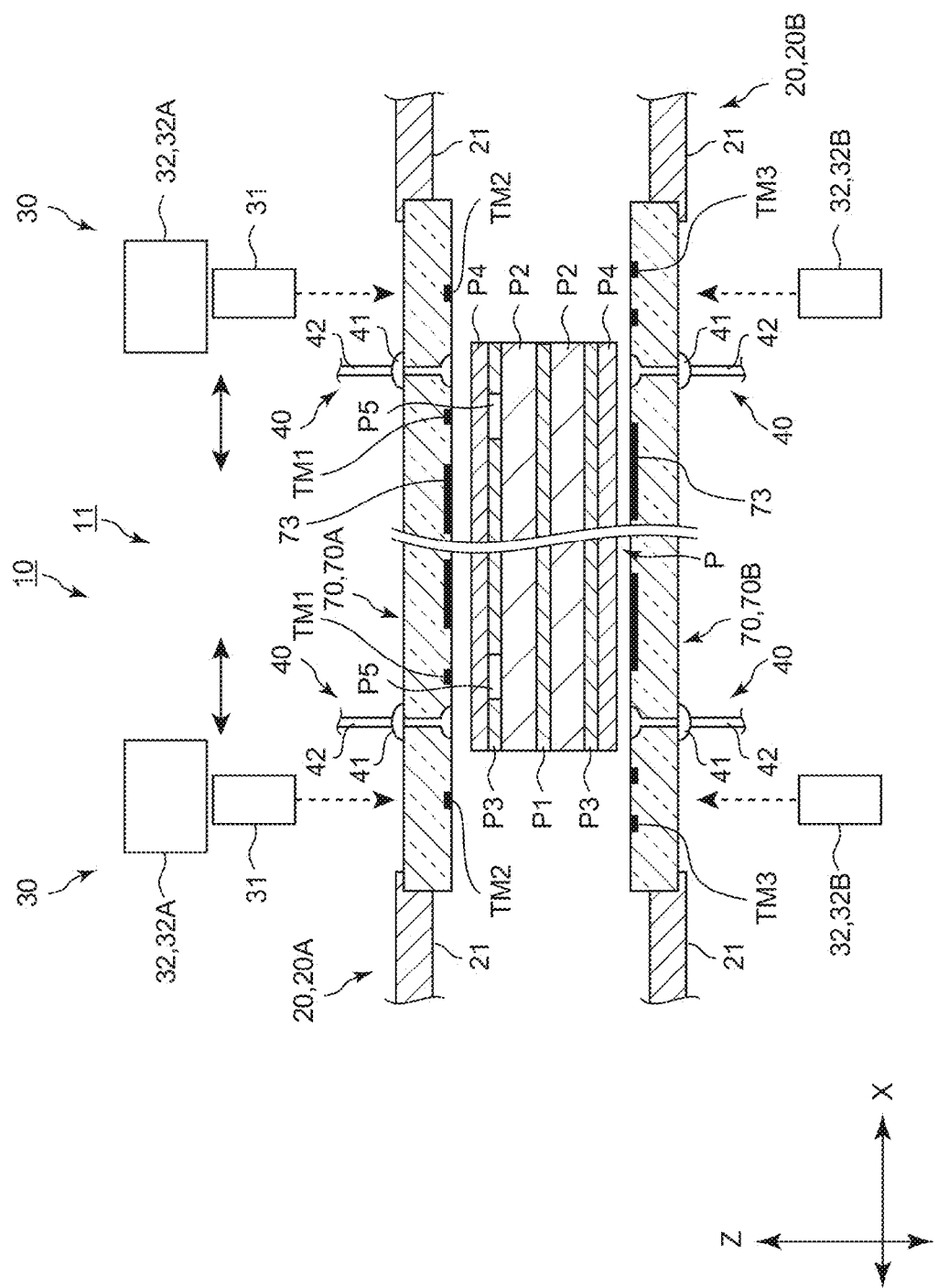
FIG. 1 is a side cross-sectional view schematically illustrating a substantial part of an exposure apparatus according to one embodiment of the present invention.

To begin with, the flexible printed circuit (substrate) P as a target of exposure will be described. FIG. 1 is a side cross-sectional view illustrating the structure of a substantial part of the exposure apparatus 10 and a structure of the substrate P. As illustrated in FIG. 1, a photosensitive resist layer P4 (corresponding to a photosensitive material) is formed on each of both front and rear faces of the flexible printed circuit (hereinafter, one before undergoing a manufacturing process such as exposure is also referred to as a substrate) P on which circuit patterns are to be formed through various steps.

More specifically, the substrate P has a base material layer P1, conductive layers P2 provided on both front and rear faces of the base material layer P1, transparent film layers P3 provided on faces of the conductive layers P2, the faces being opposite to the base material layer P1, and photosensitive resist layers P4 provided on both faces of the transparent film layers P3, the faces being opposite to the conductive layers P2. The base material layer P1 is formed of a polyimide film for example, and the conductive layers P2 are formed of a copper foil for example. Further, the transparent film layers P3 are formed of a polyimide film. The thickness of such a substrate P is about 100 μm to 200 μm in its entirety, which allows the substrate to be fixed flatly while preventing swelling or warping during fixation by vacuum suction to a photomask 70, which will be described later.

Note that besides them, adhesive layers between the base material layer P1 and the conductive layers P2, through holes connecting the conductive layers P2 to each other, and so on exist in the substrate P, but descriptions thereof are omitted.

In FIG. 1, substrate side marks P5 are formed in the transparent film layer P3 on an upper side (front side). The substrate side marks P5 are parts for aligning with target marks TM1, which will be described later. In the structure illustrated in FIG. 1, each substrate side marks P5 is a ring-shaped pattern having an inside diameter larger than the diameter of a target mark TM1. There are provided two substrate side marks P5 in the structure illustrated in FIG. 1. The positional relationship between these two is such that they are at positions corresponding to the target marks TM1, which will be described later. Note that the length of a line linking the two substrate side marks P5 is the same as the length of a line linking the two target marks TM1.

<Structure of the Exposure Apparatus 10>

An aligning mechanism 11 of the exposure apparatus 10 in this embodiment is for aligning both faces of the substrate P with respective photomasks 70 for exposure.

Figure 2:
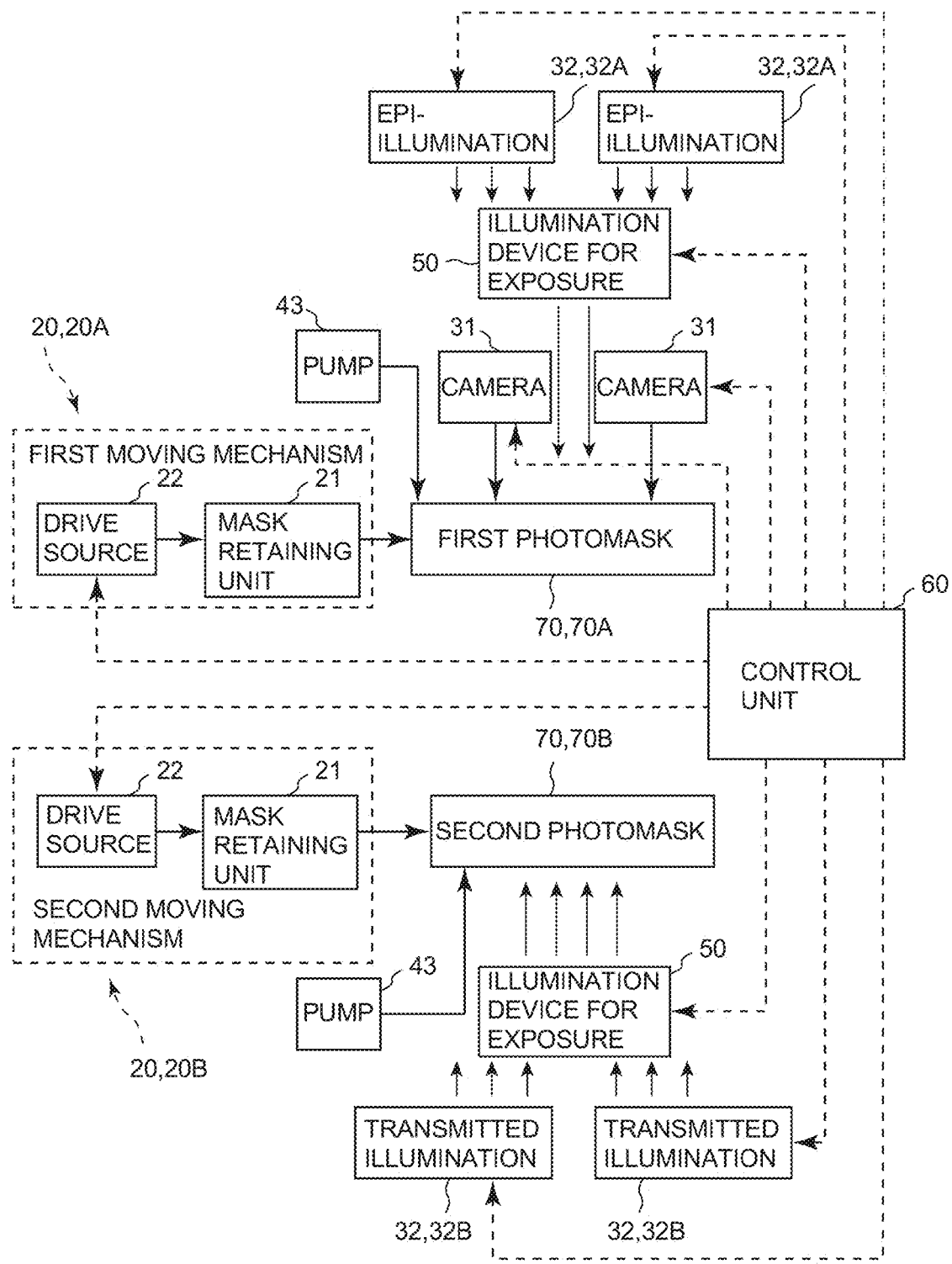
FIG. 2 is a block diagram schematically illustrating the substantial part of the exposure apparatus of FIG. 1.

FIG. 2 is a block diagram schematically illustrating the substantial part of the exposure apparatus 10. As illustrated in FIG. 1 and FIG. 2, the aligning mechanism 11 of the exposure apparatus 10 has moving mechanisms 20. Each moving mechanism 20 moves a photomask 70 in a state that an edge of the photomask 70 is retained. For this purpose, the moving mechanism 20 has a mask retaining unit 21 for retaining an edge of the photomask 70, a drive source 22 (for example, a motor or the like) for giving driving force for moving the mask retaining unit 21, and a driving force transmitting mechanism (omitted from illustration) for transmitting driving force generated in the drive source 22 to the mask retaining unit 21. Thus, by actuating the drive source 22, the moving mechanism 20 is capable of moving the mask retaining unit 21 in three directions of XYZ, and also capable of moving it in a rotational direction (θ direction). Here, the θ direction may be a rotational direction on an XY plane, a rotational direction on a YZ plane, or a rotational direction on a ZX plane.

Here, as illustrated in FIG. 1, in the exposure apparatus 10 of this embodiment, the photomasks 70 are disposed in parallel to the XY plane (horizontal plane). Such a structure has high affinities with a mechanism for carrying in or out the substrate P, and the like, and is capable of improving productivity.

However, in the exposure apparatus 10, the front faces and rear faces of the photomasks 70 may be arranged in parallel to the vertical direction (Z direction), or these front faces and rear faces may be arranged in an oblique direction with respect to the XY plane (horizontal plane). When the front faces and rear faces of the photomasks 70 are arranged in parallel to the vertical direction (Z direction), it is possible to reduce the influence of bending of the photomasks 70 by their own weights, or the like, and it is possible to align the photomasks 70 with the substrate P more accurately.

As illustrated in FIG. 1, a pair of moving mechanisms 20 is provided. Specifically, there are a first moving mechanism 20A located on an upper side of the substrate P in FIG. 1, and a second moving mechanism 20B located on a lower side of the substrate P in FIG. 1. The first moving mechanism 20A holds the photomask 70 on the upper side of the substrate P, and aligns this photomask 70 with an upper face side of the substrate P. On the other hand, the second moving mechanism 20B holds the photomask 70 on the lower side of the substrate P, and aligns this photomask 70 with a lower face side of the substrate P.

Note that the drive source for the first moving mechanism 20A corresponds to a first drive source, and the drive source for the second moving mechanism 20B corresponds to a second drive source.

As illustrated in FIG. 1, the aligning mechanism 11 of the exposure apparatus 10 has an imaging device 30 corresponding to an imaging means. The imaging device 30 has cameras 31 and illuminations 32. Each camera 31 has an imaging element using, for example, CCD (Charge Coupled Device), CMOS (Complementary Metal Oxide Semiconductor), or the like, and is capable of imaging a target mark TM, which will be described later, and the vicinity thereof.

Further, the illuminations 32 are for irradiating light for making a target mark TM easily identifiable when it is imaged with the camera 31, and this is irradiation of light increases a difference in gradations between the target mark TM and the vicinity thereof. However, the light emitted from the illuminations 32 gives almost no photosensitive action to the photosensitive resist layers P4. The illuminations 32 include a coaxial epi-illumination (hereinafter referred to as epi-illumination) 32A irradiating light from the upper side of the substrate P and the photomasks 70 and a transmitted illumination 32B irradiating light from the lower side of the substrate P and the photomasks 70.

Note that in the structure illustrated in FIG. 1, two cameras 31 are provided corresponding to the number of suction holes 72 of the upper photomask 70. Further, the cameras 31 are movable in parallel to the photomasks 70 in the structure illustrated in FIG. 1, and this movement is carried out by actuating a drive source such as a motor. However, cameras 31 may be provided at all reading positions of target marks TM, which will be described later, and the cameras 31 may be structured not to be moved by actuating a drive source such as a motor. Further, in the structure illustrated in FIG. 1, instead of providing two cameras, only one camera 31 may be provided, or three or more cameras 31 may be provided.

Note that besides the cameras 31, also the illumination 32 may be movable by actuating a drive source such as a motor, but regardless of whether the cameras 31 move by actuating the drive source or not, the illuminations 32 may be disposed at the reading positions of target marks TM in advance.

Further, the aligning mechanism 11 of the exposure apparatus 10 is provided with a suction/blow mechanism 40. The suction/blow mechanism 40 comes in contact with the surrounding of a suction hole 72 in the photomasks 70, which will be described later, and gives negative pressure for retaining the substrate P. This suction/blow mechanism 40 includes suction pads 41, suction pipes 42, and pumps 43. The suction pads 41 come in contact with the front face or rear face of the photomask 70 and give negative pressure for retaining the substrate P. Further, one end of each suction pipe 42 communicates with a suction pad 41 and the other end thereof is connected to a pump 43. The pumps 43 apply negative pressure via the suction pipes 42 and the suction pads 41 when the substrate P is retained, and this negative pressure is applied to the substrate P via suction holes 72 of the photomasks 70. On the other hand, when the retention of the substrate P is released, the pumps 43 send air (or blow or apply positive pressure) to the suction pads 41 via the suction pipes 42, thereby releasing the retention of the substrate P.

Note that two pumps 43 are provided for example. Thus, it is possible to vacuum suck or blow on the upper photomask 70 and the lower photomask 70 separately by the two pumps 43. However, a structure may be employed in which one pump 43 is provided and a switching valve for opening/closing the suction pipes 42 is provided in a middle part of each suction pipe 42, or the like, or a structure may be employed in which three or more pumps 43 are provided. Note that the suction/blow mechanism 40 corresponds to a pressure generating means. Further, in the suction/blow mechanism 40, a part vacuum sucking or blowing on the upper photomask 70 corresponds to a first pressure generating means, and a part vacuum sucking or blowing on the lower photomask 70 corresponds to a second pressure generating means.

Further, as illustrated in FIG. 2, the exposure apparatus 10 has an illumination device 50 for exposure besides the aligning mechanism 11. The illumination device 50 for exposure has a light source such as a high-pressure mercury light for example (omitted from illustration), and light from this light source is irradiated to the photosensitive resist layers P4 of the substrate P. Note that the illumination device 50 for exposure has, besides the light source, optical elements such as a lens, a mirror, a fly-eye, and so on (omitted from illustration) for irradiating light with a high degree of parallelism to the photomasks 70.

Note that a structure may be employed in which the illumination device 50 for exposure is provided on each of the upper side and the lower side. In this case, it is possible to expose the front side and rear side of the substrate P simultaneously. On the other hand, for example, a structure may be employed which is provided with an illumination device 50 for exposure performing illumination of either of the upper side and lower side. When the illumination device 50 for exposure performing illumination of either of the is upper side and lower side is provided, it may be structured to have an optical system for guiding light to the upper side of the substrate P and an optical system for guiding light to the lower side of the substrate P, and switch which of the upper side and lower side of the substrate P the light is guided to by a shutter or the like. When the illumination device 50 for exposure performing illumination of either of the upper side and lower side is provided thus, as compared to the structure in which the exposure illumination devices 50 are provided on the upper side and lower side respectively, productivity is low but costs for the illumination device 50 for exposure are low, and size reduction of the exposure apparatus 10 is possible. It is also possible to suppress power consumption.

As illustrated in FIG. 2, the aligning mechanism 11 of the exposure apparatus 10 is provided with a control unit 60. The control unit 60 controls actuation of the drive sources 22, the cameras 31, the pumps 43, and so on. Note that the control unit 60 may control actuation of the illuminations 32 and actuation of not illustrated valves besides them.

<Regarding the Photomasks 70>

Figure 3A:
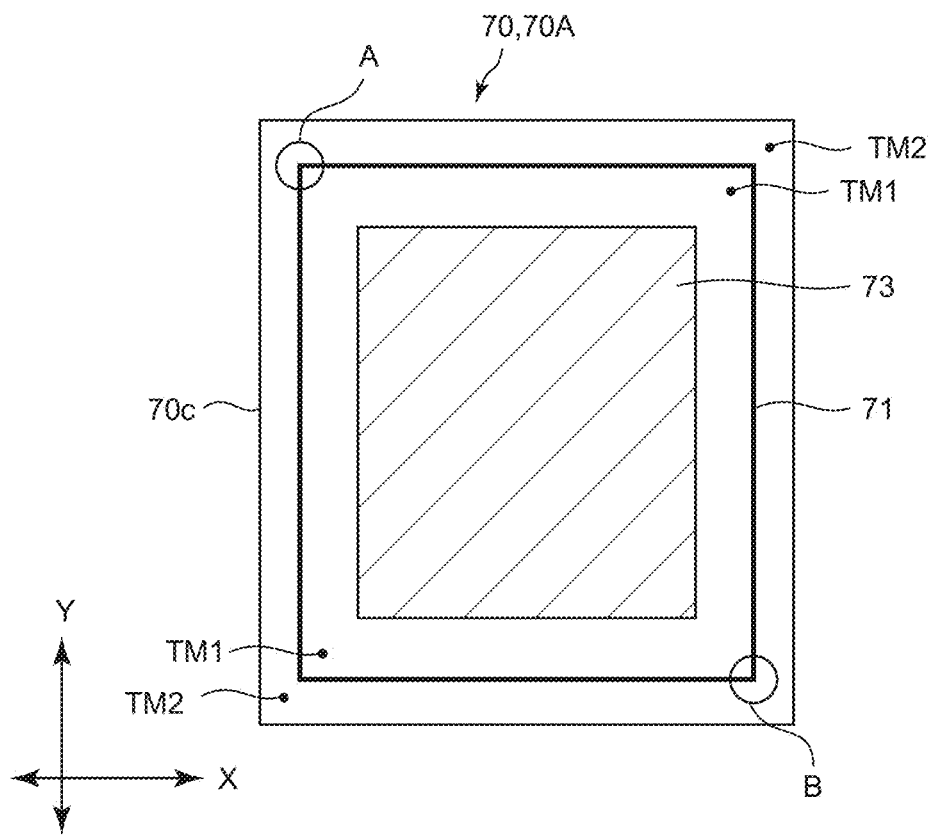
FIG. 3A is a plan view illustrating a structure of a first photomask.
Figure 3B:
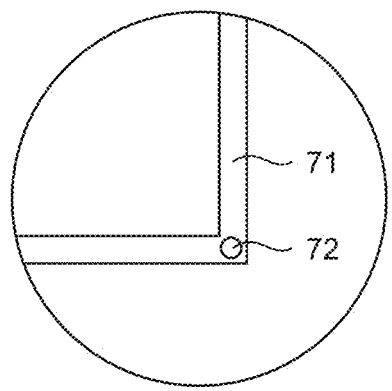
FIG. 3B is a partial plan view illustrating an enlarged portion A and portion B where a suction hole is provided.
Figure 4:
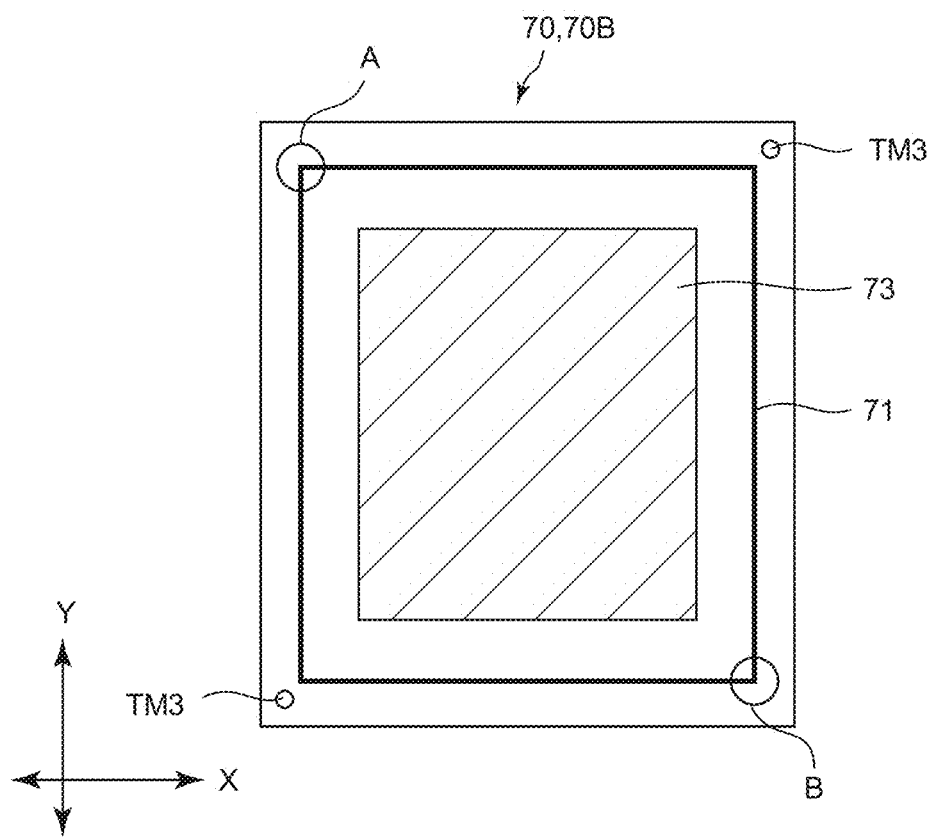
FIG. 4 is a plan view illustrating a structure of the second photomask.
Figure 5:
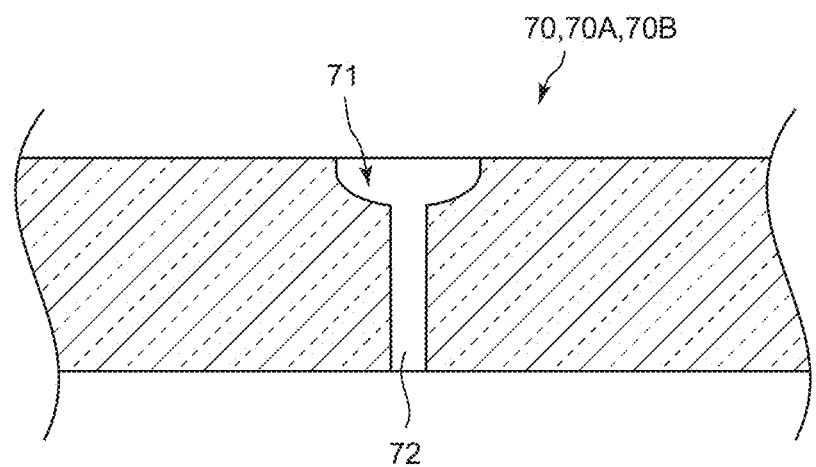
FIG. 5 is a partial side cross-sectional view illustrating a structure of the photomasks.

Next, the photomasks 70 will be described. FIGS. 3A and 3B are plan views illustrating a structure of the upper photomask 70 (first photomask 70A which will be described later). FIG. 3A is a plan view illustrating an entire photomask 70, and FIG. 3B is a partial plan view illustrating an enlarged portion A and portion B as corner portions of the photomask 70 of FIG. 3A. Further, FIG. 4 is a plan view illustrating a structure of the lower photomask 70 (second photomask 70B which will be described later). Note that a portion A and a portion B in FIG. 4 are similar to those in FIG. 3B. Further, FIG. 5 is a cross-sectional view illustrating a structure of the photomasks 70.

A photomask 70 in this embodiment is a glass mask made of glass, which has a small dimensional variation and is able to correspond to high accuracy. However, the photomask 70 may be formed of material other than glass such as a PET film for example. Further, as illustrated in FIG. 3A and FIG. 4, the photomask 70 of this embodiment is provided in a rectangular shape. However, the photomask 70 may have a shape other than the rectangular shape.

Note that when the photomask 70 is a glass mask, its thickness is preferred to be about 3 mm to 10 mm, more preferably about 5 mm.

A suction trench 71 is provided in one face of the photomask 70. The suction trench 71 is provided at a position shifted more toward the side of an outer peripheral edge 70c than the center side thereof in the photomask 70. Describing more specifically, the suction trench 71 is provided at a position located as follows with respect to the outer peripheral edge 70c. That is, on the outer peripheral edge 70c side of the photomask 70, there is a retained portion to be retained by the mask retaining unit 21. Further, there is a predetermined space from the retained portion toward the center side, and this space is for forming the target marks TM, which will be described later. Accordingly, the suction trench 71 exists at a position separating the retained portion and a target forming portion with respect to the outer peripheral edge 70c. Further, as illustrated in FIG. 3A and FIG. 4, in this embodiment, the suction trench 71 is formed in a square ring shape.

Note that in a portion surrounded by the suction trench 71 in the photomask 70, a drawing pattern 73 for exposure of the photosensitive resist layers P4 of the substrate P is formed.

Further, as illustrated in FIG. 3A to FIG. 5, at a predetermined portion of the suction trench 71, a suction hole 72 is provided to penetrate the photomask 70 from a bottom portion of the suction trench 71 to the other face. In this embodiment, as illustrated in FIGS. 3A and 3B and FIG. 4, the suction hole 72 is provided at a corner portion of the suction trench 71 having a square ring shape (portion A and portion B of FIG. 3A and FIG. 4). However, the suction hole 72 may be provided at a portion other than the corner portion. Further, at least one suction hole 72 is provided.

Note that the diameter of the suction hole 72 is preferred to be about 1 mm to 2 mm, but the diameter of the suction hole 72 may be any diameter out of this range. Further, the width of the suction trench 71 is preferably about 1 mm to 4 mm, more preferably about 2 mm, but the width of the suction trench 71 may be any width out of this range. Further, the suction trench 71 and the is suction hole 72 correspond to a recessed portion.

As illustrated in FIG. 1, FIG. 3A and FIG. 4, the photomask 70 is provided with target marks TM. Among the target marks TM, ones for the upper photomask 70 (hereinafter referred to as a first photomask 70A as necessary) and ones for the lower photomask 70 (hereinafter referred to as a second photomask 70B as necessary) are different.

Figure 6A:
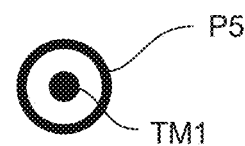
FIG. 6A is a plan view illustrating alignment between a target mark of the first photomask and a substrate side mark of a substrate.

Specifically, on the inside surrounded by the ring-shaped suction trench 71 on the first photomask 70A, target marks TM1 are provided for aligning with the substrate side marks P5 of the substrate P. The target marks TM1 correspond to a first alignment mark Note that FIG. 6A illustrates alignment between a target mark TM1 and a substrate side mark P5. As illustrated in FIG. 6A, the target marks TM 1 are provided to have a circular shape so as to correspond to the substrate side marks P5, and are also non-light-transmissive portions through which it is difficult to transmit light. Note that such target marks TM1 may be formed of the same material as the drawing pattern 73, such as a chrome film or a blackened metal silver film for example.

Further, as illustrated in FIG. 1 and FIG. 3A, in this embodiment, two target marks TM 1 are provided in the first photomask 70A. The positional relationship of these two is such that they are shifted toward (close to) two corner portions (corner portions other than the portion A and portion B) located in a diagonal direction among the four corners of the ring-shaped suction trench 71 in the photomask illustrated in FIG. 3A. However, as illustrated in FIG. 3A, when short sides of the rectangular photomask 70 are along the X direction and long sides thereof are along the Y direction, the line linking two target marks TM1 may be in parallel to the X direction or to the Y direction. Further, the line linking two target marks TM 1 need not be in parallel to either of the X direction and the Y direction.

Further, on the outside of the ring-shaped suction trench 71 on the first photomask 70A, target marks TM2 are provided for aligning with the second photomask 70B. The target marks TM2 correspond to a second alignment mark. In the structure illustrated in FIG. 3A, the target marks TM2 are circular non-light-transmissive portions similarly to the above-described target marks TM1.

Further, there are provided two target marks TM2 on the first photomask 70A, similarly to the above-described target marks TM 1. The positional relationship of these two target marks TM2 is also similar to that of the above-described target marks TM1. However, among the four corner portions of the ring-shaped suction trench 71, the target marks TM2 may be close to the corner portions to which the target marks TM1 are close, but the target marks TM2 may also be close to corner portions different from them.

Further, as illustrated in FIG. 4, also the second photomask 70B is provided with target marks TM3. These target marks TM3 are for aligning with the target marks TM2 of the first photomask 70A. Specifically, the target marks TM3 are provided on the outside of the ring-shaped suction trench 71 in the second photomask 70B. Moreover, when the second photomask 70B is seen in a plan view, the target marks TM3 are provided at positions where their centers can be overlaid on the centers of the target marks TM2. Note that the target marks TM3 correspond to a third alignment mark.

To be at such positions, the target marks TM3 are provided closely at the same corner portions to which the target marks TM2 are close (corner portions other than the portion A and portion B) among the four corner portions of the ring-shaped suction trench 71. Further, the length of a line linking two target marks TM3 is the same as the length of a line linking the two target marks TM2.

Figure 6B:
FIG. 6B is a plan view illustrating alignment between a target mark of the first photomask and a target mark of a second photomask.

Note that FIG. 6B illustrates alignment between a target mark TM2 and a target mark TM3. In this embodiment, as illustrated in FIG. 4 and FIG. 6B, the target mark TM3 is provided to have a circular ring shape. The inside diameter of the target mark TM3 having a circular ring shape is set larger than the diameter of the target mark TM2. Further, a portion surrounded by the target mark TM3 having a circular ring shape is a light-transmissive portion where a coating film for forming this target mark TM3 is not formed.

<Regarding an Exposure Method Using the Exposure Apparatus 10>

Next, an exposure method using the above-described exposure apparatus 10 will be described.

Figure 7:
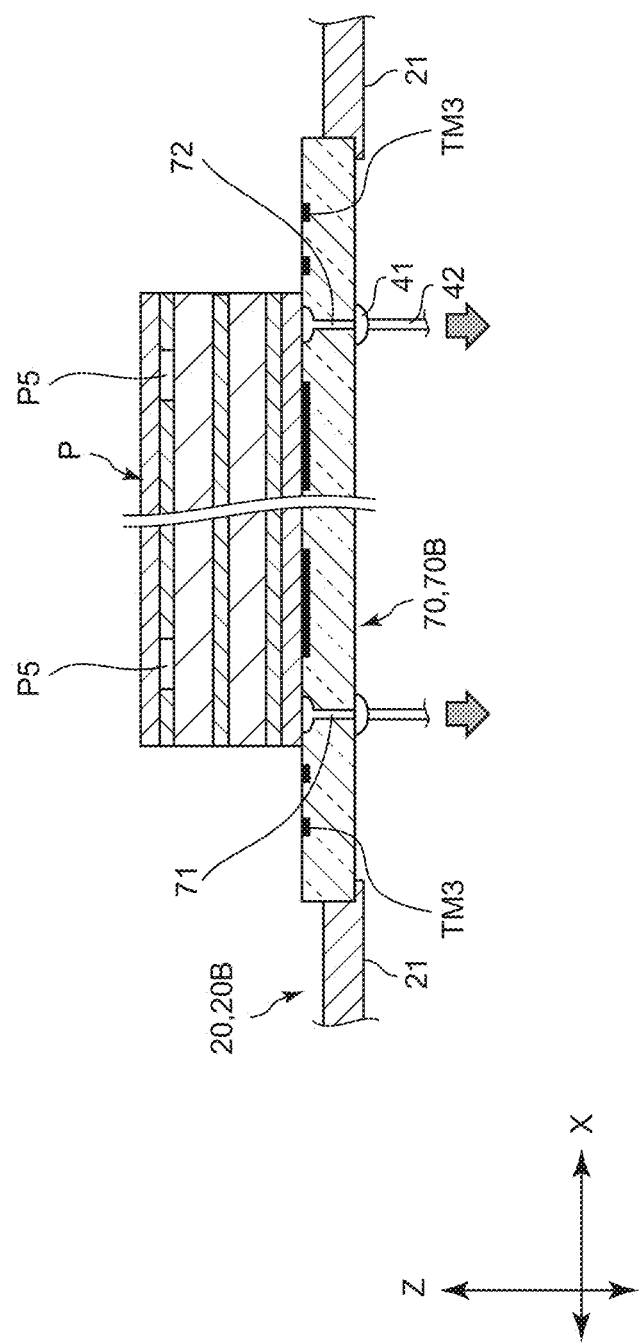
FIG. 7 is a side cross-sectional view illustrating a state that the substrate is temporary fixed to the second photomask.

First, as illustrated in FIG. 7, the substrate P on which the photosensitive resist layers P4 are formed is placed on the lower second photomask 70B. Then, based on the control by the control unit 60, the suction/blow mechanism 40 gives negative pressure to the rear face (lower face) of the substrate P via the suction holes 72 and the ring-shaped suction trench 71, so as to vacuum suck the substrate P. The substrate P is thus sucked and fixed onto the second photomask 70B. The fixation of the substrate P at this time is, so to speak, a temporary fixation by which alignment with the second photomask 70B is not performed.

Figure 8:
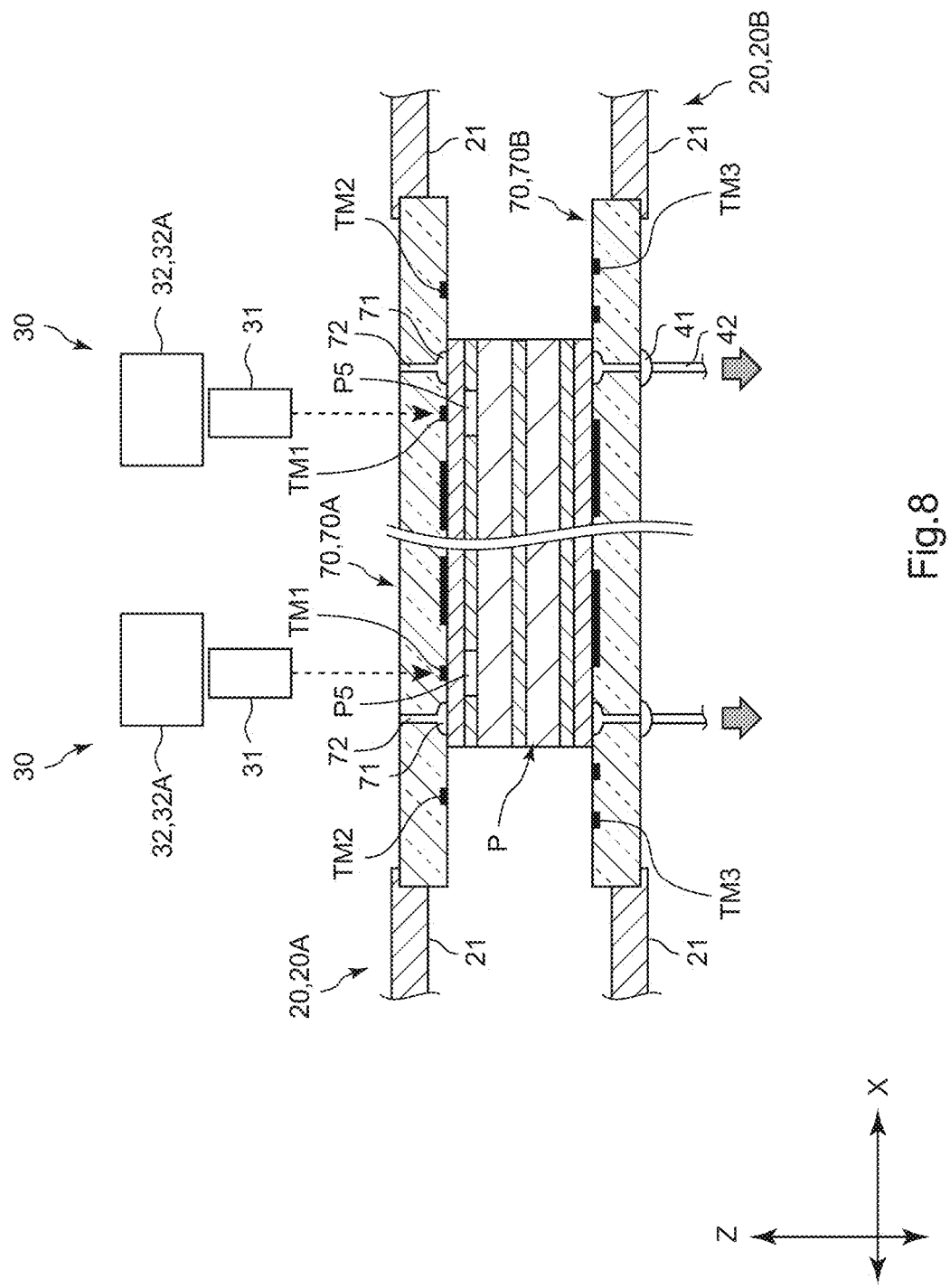
FIG. 8 is a side cross-sectional view illustrating an image of performing alignment between the first photomask and the substrate.

Next, as illustrated in FIG. 8, the control unit 60 performs control such that the positional relationship between the first photomask 70A and the substrate P is imaged with the cameras 31 (first imaging step), and the drive source 22 is actuated based on results of the imaging with the cameras 31 to adjust the position of the first photomask 70A in the XYZ directions and the position thereof in the θ direction (first alignment step). At this time, also the epi-illumination 32A is illuminated, creating a state that enables good image recognition with the cameras 31. Note that when the position in the Z direction is at a desired position in advance, the position adjustment in the Z direction may be omitted. At this time, through the cameras 31, the alignment is performed until the target marks TM 1 and the substrate side marks P5 of the substrate P are at desired positions.

Here, at the stage before performing the alignment, although rough alignment is performed between the first photomask 70A and the substrate P, the accuracy thereof is not good. Accordingly, as illustrated in FIG. 6A, the first photomask 70A is moved via the first moving mechanism 20A so that the centers of the target marks TM1 fall within a predetermined error range with respect to the centers of the substrate side marks P5, thereby performing alignment between the first photomask 70A and the substrate P.

Note that in such alignment, the first photomask 70A and the substrate P is brought to a state that a predetermined gap (for example, a gap of about 10 μm to 100 μm) exists therebetween, and in this state the first photomask 70A is moved via the first moving mechanism 20A. Then, after the alignment between the first photomask 70A and the substrate P is performed, the first photomask 70A is brought into contact with the substrate P, and the state of the alignment between the target marks TM1 and the substrate side marks P5 is checked via the cameras 31.

When it is judged through this check that the centers of the target marks TM1 do not fall within the predetermined error range with respect to the centers of the substrate side marks P5, the gap between the first photomask 70A and the substrate P is made again, the position of the first photomask 70A relative to the substrate P is adjusted again, thereafter the first photomask 70A is brought into contact with the substrate P, and whether or not the centers of the target marks TM1 fall within the predetermined error range with respect to the centers of the substrate side marks P5 is checked again. Then, such operation is repeated until the centers of the target marks TM1 fall within the predetermined error range with respect to the centers of the substrate side marks P5.

Figure 9:
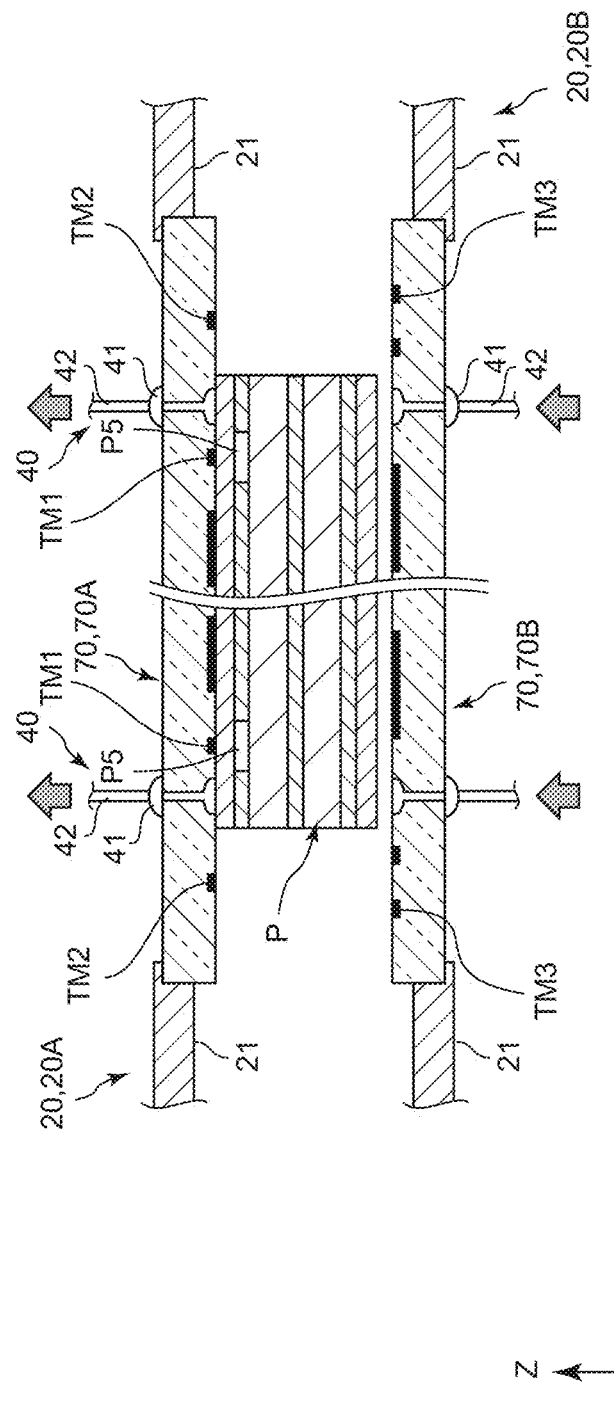
FIG. 9 is a side cross-sectional view illustrating a state that the substrate is retained by the first photomask and retention of the substrate by the second photomask is released.

When the centers of the target marks TM1 fall within the predetermined error range with respect to the centers of the substrate side marks P5, subsequently the substrate P is retained by the first photomask 70A as illustrated in FIG. 9 (first position retaining step), and retention of the substrate P by the second photomask 70B is released. That is, the substrate P is handed over to the first photomask 70A. At this time, the control unit 60 performs control such that the pump 43 for the upper side performs a suction operation, negative pressure is given to the portion surrounded by the substrate P and the suction trench 71 via the suction pipes 42 directed toward the first photomask 70A, and the suction holes 72 and the suction trench 71 of the first photomask 70A, thereby retaining the substrate P by the first photomask 70A. On the other hand, the control unit 60 performs control such that the pump 43 for the lower side performs a blow operation to send air to the portion surrounded by the substrate P and the suction trench 71 via the suction pipes 42 directed toward the second photomask 70B, and the suction holes 72 and the suction trench 71 of the second photomask 70B, thereby releasing the retention state of the substrate P by the second photomask 70B.

In this case, until handing over of the substrate P to the first photomask 70A finishes, the state of the position adjustment between the centers of the target marks TM1 and the centers of the substrate side marks P5 is maintained. Thus, the positional accuracy between the first photomask 70A and the substrate P is maintained.

Figure 10:
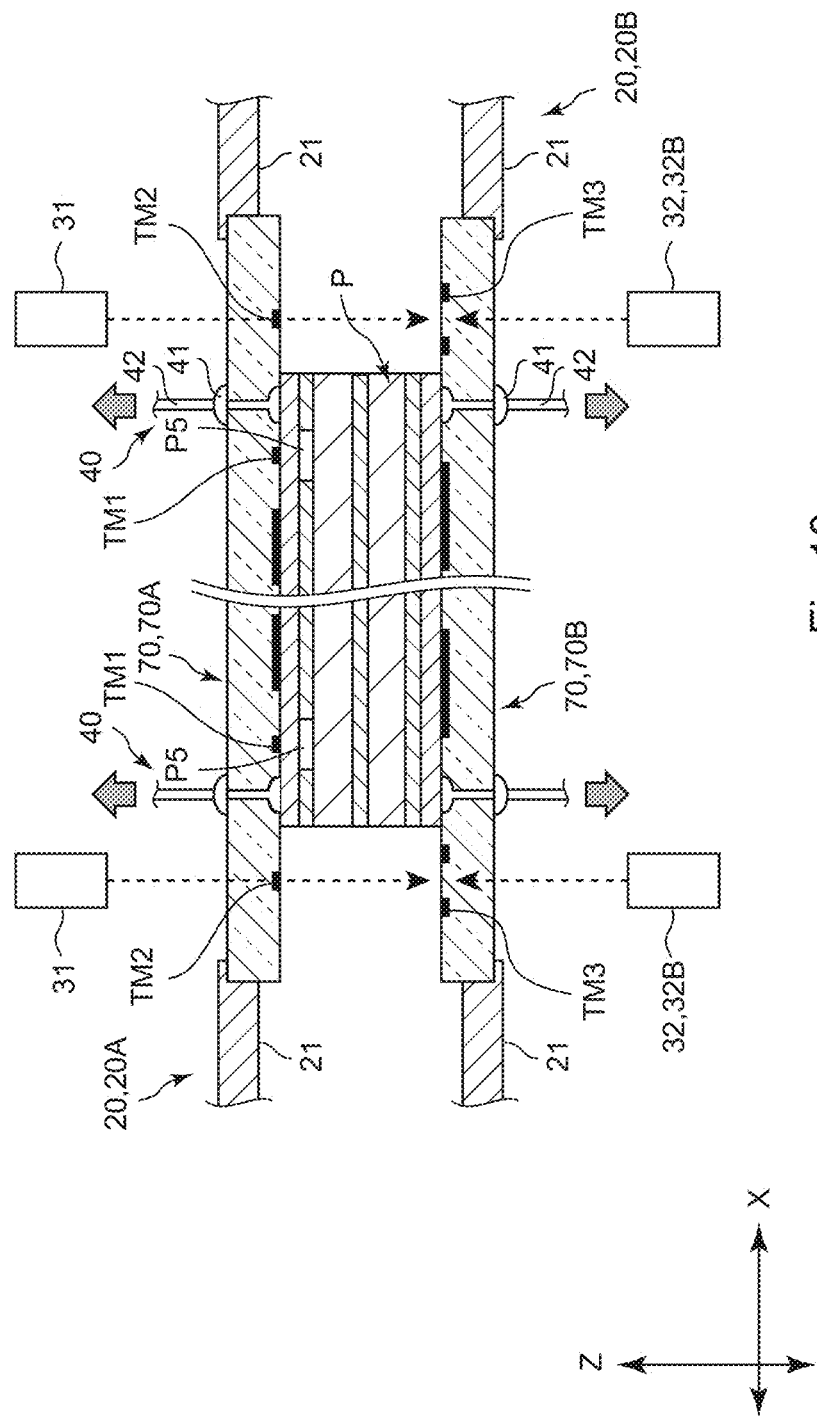
FIG. 10 is a side cross-sectional view illustrating an image of performing alignment between the first photomask and the second photomask and a state of further retaining the substrate by the second photomask while the retention state of the substrate by the first photomask is maintained.

Next, as illustrated in FIG. 10, the control unit 60 performs control such that the positional relationship between the first photomask 70A and the second photomask 70B is imaged with the cameras 31 (second imaging step), and the drive source 22 is actuated based on results of the imaging with the cameras 31 to adjust the position of the second photomask 70B in the XYZ directions and the position thereof in the θ direction (second alignment step). At this time, also the transmitted illumination 32B is illuminated, creating a state that enables good image recognition with the cameras 31. Note that when the position in the Z direction is at a desired position in advance, the position adjustment in the Z direction may be omitted. At this time, through the cameras 31, the alignment is performed until the target marks TM2 and the target marks TM3 are at desired positions.

At this time, as illustrated in FIG. 6B, the second photomask 70B is moved via the second moving mechanism 20B so that the centers of the target marks TM2 fall within a predetermined error range with respect to the centers of the target marks TM3, thereby performing alignment between the first photomask 70A and the second photomask 70B.

Note that in such alignment, the second photomask 70B and the substrate P is brought to a state that a predetermined gap (for example, a gap of about 10 μm to 100 μm) exists therebetween, and in this state the second photomask 70B is moved via the second moving mechanism 20B. Then, after the alignment between the first photomask 70A and the second photomask 70B is performed, the second photomask 70B is brought into contact with the substrate P, and the state of the alignment between the target marks TM2 and the target marks TM3 is checked via the cameras 31.

When it is judged through this check that the centers of the target marks TM2 do not fall within the predetermined error range with respect to the centers of the target marks TM3, the gap between the second photomask 70B and the substrate P is made again, the position of the second photomask 70B is adjusted again, thereafter the second photomask 70B is brought into contact with the substrate P, and whether or not the centers of the target marks TM2 fall within the predetermined error range with respect to the centers of the target marks TM3 is checked again. Then, such operation is repeated until the centers of the target marks TM2 fall within the predetermined error range with respect to the centers of the target marks TM3.

When the centers of the target marks TM2 fall within the predetermined error range with respect to the centers of the target marks TM3, subsequently the substrate P is further retained by the second photomask 70B while the retention state of the substrate P by the first photomask 70A is maintained (second position retaining step). The state at this time is illustrated in FIG. 10. In this case, the control unit 60 performs control such that the pump 43 for the lower side performs a suction operation, negative pressure is given to the portion surrounded by the substrate P and the suction trench 71 via the suction pipes 42 directed toward the second photomask 70B, and the suction holes 72 and the suction trench 71 of the second photomask 70B, thereby retaining the substrate P by the second photomask 70B.

As described above, after a state that the first photomask 70A and the second photomask 70B both retain the substrate P is created, the illumination device 50 for exposure is actuated to expose both faces of the substrate P (exposing step).

Figure 11:
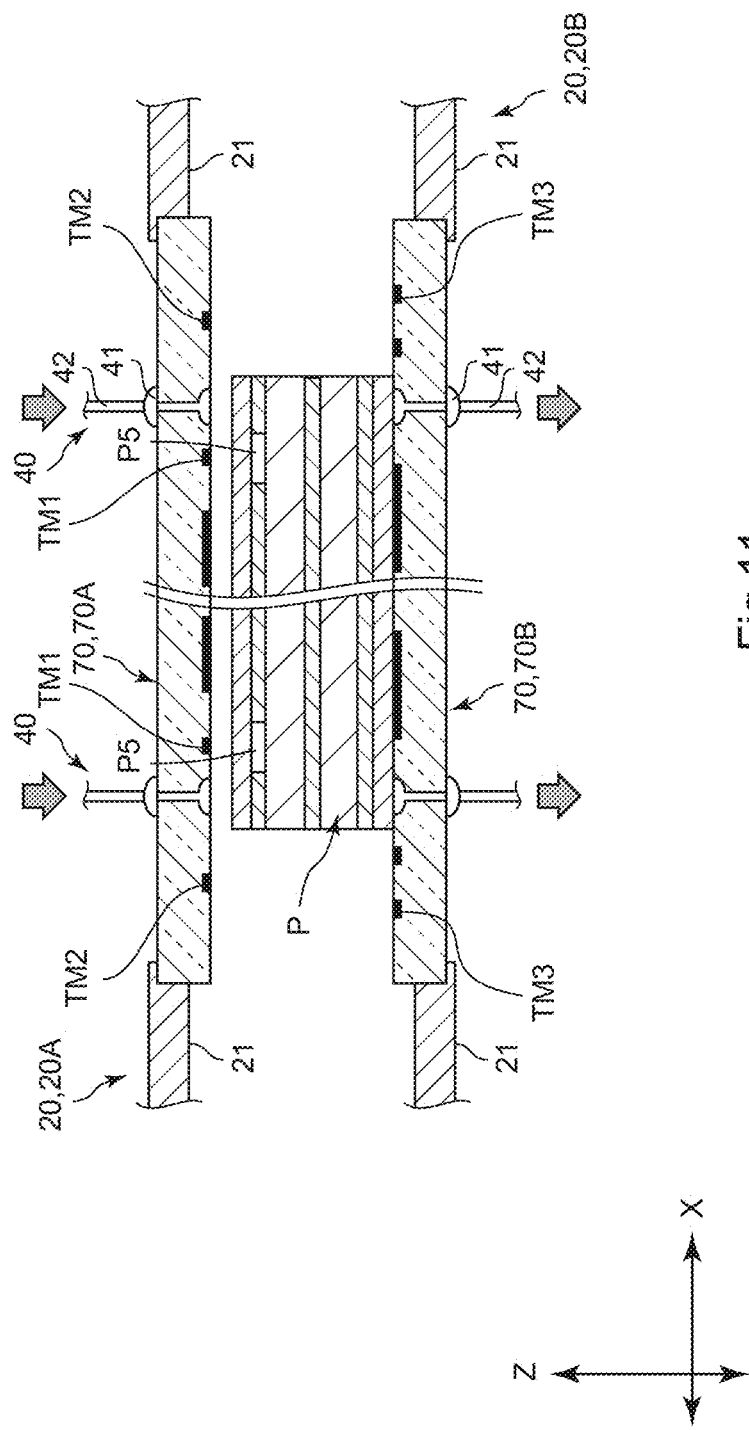
FIG. 11 is a side-cross-sectional view illustrating a state that retention of the substrate by the first photomask is released while the retention state of the substrate by the second photomask is maintained.

Subsequently, as illustrated in FIG. 11, while the retention state of the substrate P by the second photomask 70B is maintained, the retention of the substrate P by the first photomask 70A is released. That is, the substrate P is handed over to the second photomask 70B. At this time, while maintaining the suction operation of the pump 43 for the lower side, the control unit 60 performs control such that the pump 43 for the upper side performs a blow operation to send air to the portion surrounded by the substrate P and the suction trench 71 via the suction pipes 42 directed toward the first photomask 70A, and the suction holes 72 and the suction trench 71 of the first photomask 70A, thereby releasing the retention state of the substrate P by the first photomask 70A.

Thereafter, the control unit 60 performs control such that the pump 43 for the lower side performs a blow operation to send air to the portion surrounded by the substrate P and the suction trench 71 via the suction pipes 42 directed toward the second photomask 70B, and the suction holes 72 and the suction trench 71 of the second photomask 70B, thereby releasing the retention state of the substrate P by the second photomask 70B. Thus, even when the second photomask 70B and the substrate P adhere to each other due to static electricity for example, removal of the substrate P becomes easy, and productivity improves. Note that regarding this removal, the second photomask 70B may be moved to a removal point of the substrate P by actuating the second moving mechanism 20B, and then the substrate P may be removed from the exposure apparatus 10.

Note that in order to further reduce the influence of adhesion of the second photomask 70B and the substrate P due to static electricity, air charged via an ionizer may be supplied to the second photomask 70B from the pump 43 for the lower side.

<Effects>

With the photomasks, the exposure apparatus 10, and the exposure method structured as above, it is possible to perform alignment between the first photomask 70A and the substrate P by performing alignment between the target marks TM1 and the substrate side marks P5. In addition, it is possible to perform alignment between the first photomask 70A and the second photomask 70B by performing alignment between the target marks TM2 and the target marks TM3. Thus, it is possible to perform alignment between the first photomask 70A and the substrate P as well as the second photomask 70B and the substrate P (alignment of both faces of the substrate P).

In this case, based on the control by the control unit 60, while performing imaging with the cameras 31, the moving mechanisms 20 are actuated to perform alignment between the target marks TM1 and the is substrate side marks P5 and further alignment between the target marks TM2 and the target marks TM3, thereby enabling highly accurate alignment between the first photomask 70A and the substrate P as well as the second photomask 70B and the substrate P.

Further, in this embodiment, the photomasks 70 are provided with the suction trench 71 and the suction holes 72 for applying negative pressure to the portion surrounded by the substrate P and the suction trench 71 when it is brought into contact with the substrate P. By applying negative pressure through them as described above when the photomasks 70 are brought into contact with the substrate P, the substrate P can be retained favorably by the photomasks 70. Then, when the substrate P is retained by the photomasks 70 after alignment between the photomasks 70 and the substrate P is performed, it is possible to prevent positional displacement after the alignment, thereby enabling exposure with high positional accuracy.

In this case, by applying negative pressure to the substrate P based on the control of the pumps 43 by the control unit 60, exposure with high positional accuracy as described above is possible. Further, by applying positive pressure to the substrate P after alignment based on the control by the control unit 60, removal of the substrate P is easy even when the photomasks 70 and the substrate P adhere to each other due to static electricity for example, and it is thereby possible to improve productivity.

Note that by providing the photomasks 70 with the suction trench 71 and the suction holes 72 as a recessed portion for sucking and retaining the substrate P, it is possible to favorably retain the substrate P by the photomasks 70.

Further, in this embodiment, in the first photomask 70A, the suction trench 71 is provided in a ring shape, and the target marks TM1 are provided on the inside surrounded by the ring-shaped suction trench 71. Thus, it is possible to perform alignment of the target marks TM1 while they are positioned to oppose the substrate side marks P5 of the substrate P. On the other hand, the target marks TM2 are provided on the outside of the ring-shaped suction trench 71. Thus, it is possible to perform alignment of the is target marks TM2 while they are positioned to oppose the target marks TM3 of the second photomask 70B without being blocked by the substrate P.

Further, in this embodiment, the set of the first photomask 70A and the second photomask 70B is used, and the target marks TM different from each other are formed in these photomasks 70A, 70B. They make it possible to perform not only alignment between the first photomask 70A and the substrate P, but also alignment between the first photomask 70A and the second photomask 70B. Thus, it is possible to favorably align the photomasks 70A, 70B with both faces of the substrate P.

Moreover, in this embodiment, when the first photomask 70A and the second photomask 70B are set in the exposure apparatus 10, it is possible to perform alignment between the first photomask 70A and the substrate P as well as alignment between the first photomask 70A and the second photomask 70B based on the control by the control unit 60. Thus, it is possible to perform alignment between them easily with high accuracy.

Further, in this embodiment, the control unit 60 controls driving of the pump 43 for the upper side to utilize negative pressure to retain the substrate P by the first photomask 70A after alignment between the substrate P and the first photomask 70A is performed by controlling the drive source 22. Thus, it is possible to favorably maintain a state that alignment is performed between the first photomask 70A and the substrate P. Moreover, the control unit controls driving of the pump 43 for the lower side to utilize negative pressure to retain the substrate P by the second photomask 70B after alignment between the first photomask 70A and the second photomask 70B is performed by controlling the drive source 22. Thus, it is possible to favorably maintain a state that alignment is performed between the second photomask 70B and the substrate P.

Modification Examples

In the foregoing, one embodiment of the present invention has been described, but the present invention can be modified in various other ways. Such modifications will be described below.

Figure 12:
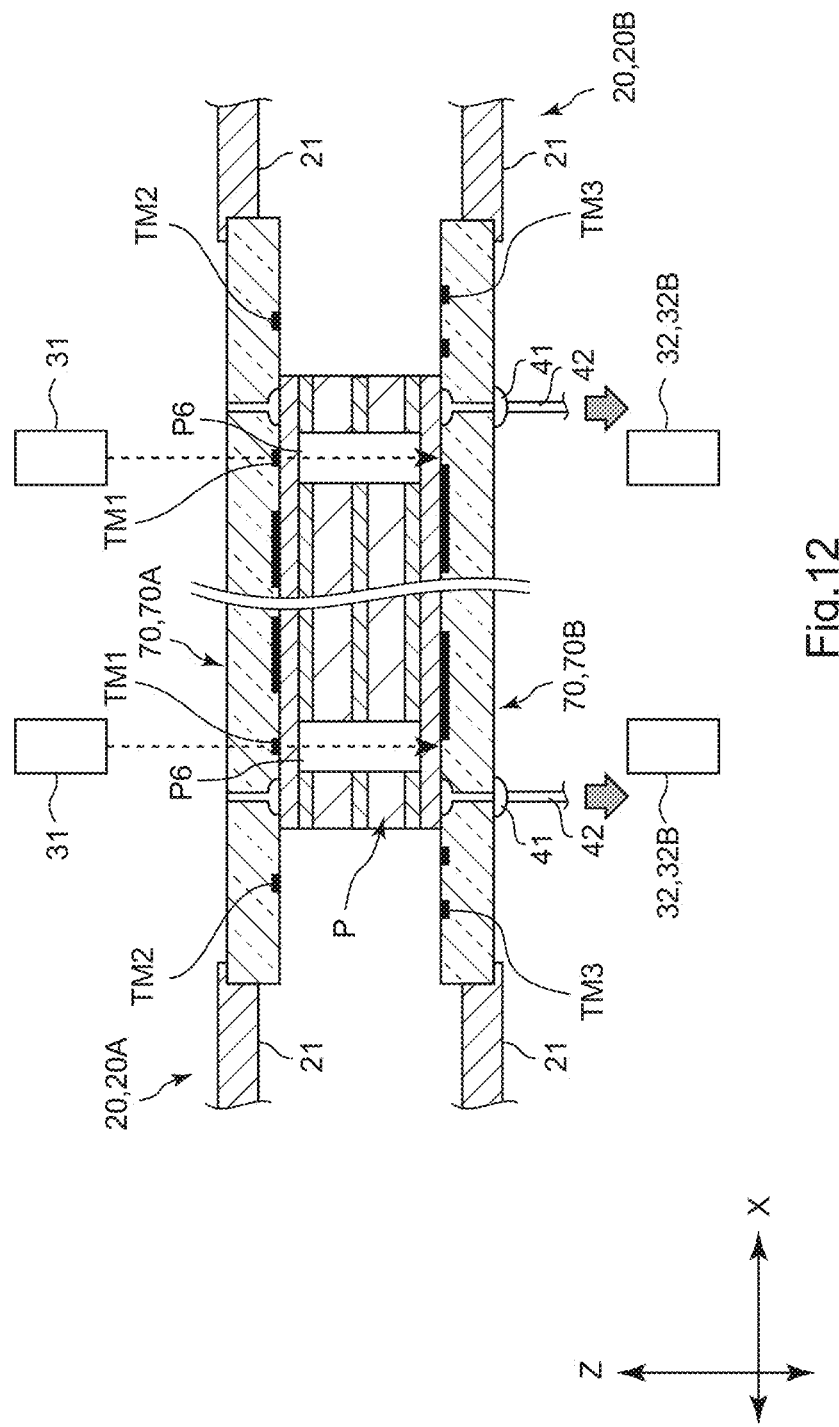
FIG. 12 is a side cross-sectional view illustrating an image performing alignment using a substrate in which through holes are formed according to a modification example of the present invention.
Figure 14:
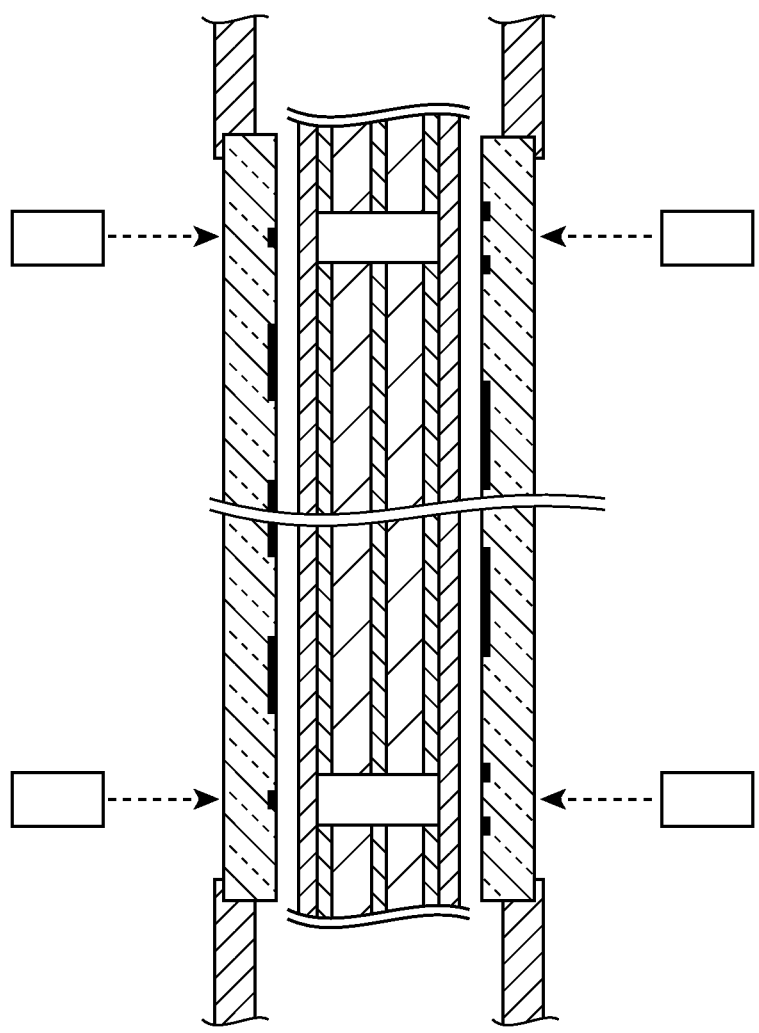
FIG. 14 is a cross-sectional view schematically illustrating a conventional exposure method of Patent Document 2.

In the above-described embodiment, the substrate P is provided with the substrate side marks P5 formed of a ring-shaped pattern. However, other substrate side marks may be provided on the substrate P instead of such substrate side marks P5 formed of a ring-shaped pattern. As such substrate side marks, for example, through holes P6 may be formed in the substrate P as illustrated in FIG. 12, and these through holes P6 may be used as the substrate side marks. Also in this manner, it is possible to favorably perform alignment between the target marks TM1 of the first photomask 70A and the through holes P6. Note that when alignment between the target marks TM1 and the through holes P6 is performed, use of the epi-illumination 32A makes recognition performance with the cameras 31 favorable.

Further, in the above-described embodiment, the substrate P is of single processing type which is cut off in a sheet form. However, the substrate is not limited to the single processing type, and may be one which is pulled off a roll winding part. In this case, a mechanism to supply the substrate from the roll winding part to the exposure area and a mechanism to roll up the substrate after exposure can be provided. In other words, it becomes possible to correspond to a roll-to-roll process.

Moreover, in the above-described embodiment, as the illuminations 32, the epi-illumination 32A and the transmitted illumination 32B are explained. As the illuminations, however, any illumination such as a ring illumination may be used as long as it allows favorable recognition of the target marks TM, the substrate side marks P5, and so on, gives almost no sensitivity to the photosensitive resist layers P4, and has light in a wavelength range which can be recognized favorably with the cameras 31. As such illumination, for example, various types of LED (Light Emitting Diodes), infrared light source, and the like may be used solely or in various combinations.

Further, in the above-described embodiment, alignment of the second photomask 70B with the first photomask 70A is performed by driving the drive source 22 of the second moving mechanism 20B. However, such alignment of the second photomask 70B with the first photomask 70A may be performed by driving the drive source 22 of the first moving mechanism 20A. Note that driving of the drive source 22 of the second moving mechanism 20B and driving of the drive source 22 of the first moving mechanism 20A may be combined for performing alignment of the second photomask 70B with the first photomask 70A.

Further, in the above-described embodiment, the exposure apparatus 10, the photomasks 70, the photomask set, and the exposure method are used for alignment and exposure of the flexible printed circuit P. However, the present invention can be applied to alignment and exposure of other than the flexible printed circuit P. Examples of such an alternative to the substrate P include a semiconductor substrate, a glass substrate, and the like.

Further, in the above-described embodiment, the ring-shaped suction trench 71 and the suction holes 72 are explained as a recessed portion. However, the recessed portion is not limited to the suction trench 71 and the suction holes 72, and may be any one. For example, a suction trench which is not ring-shaped but is cut in the middle may be used, or a depression is formed in one face of the photomask 70 and this depression may be used as the recessed portion. Note that when the area of the depression is large, a separate member for supporting the substrate P may be disposed in this depression. Further, the number of suction trenches 71 may be any number as long as there is at least one. The number of suction holes 72 may also be any number as long as there is at least one. Furthermore, for the suction trench 71, any one of various forms, such as a curved form, a zigzag form, and the like, can be employed, other than the straight form.

Further, in the above-described embodiment, the substrate P has two conductive layers P2. However, the substrate P may be structured to have three or more conductive layers P2. When it has such three or more conductive layers P2, the number of photomasks 70 is increased accordingly, and exposure of the substrate P can be carried out by replacing the photomasks 70 sequentially, or carrying the substrate P to a different position, or by another similar way.

What is claimed is:

1. An exposure apparatus for exposing both faces of a substrate wherein both the faces have a photosensitive material formed thereon, the exposure apparatus comprising:

a first moving mechanism comprising a first drive source and moving by driving the first drive source a first photomask disposed to oppose one face of the substrate at a position where exposure is performed;

a second moving mechanism comprising a second drive source and moving by driving the second drive source a second photomask disposed to oppose other face of the substrate at a position where exposure is performed;

an imaging means for imaging a first alignment mark formed on the first photomask and a substrate side mark formed on the substrate and imaging a second alignment mark formed on the first photomask and a third alignment mark formed on the second photomask;

a first pressure generating means for retaining the substrate by the first photomask by utilizing negative pressure or releasing retention of the substrate by the first photomask by utilizing positive pressure;

a second pressure generating means for retaining the substrate by the second photomask by utilizing negative pressure or releasing retention of the substrate by the second photomask by utilizing positive pressure; and a control unit for controlling driving of the first drive source, the second drive source, the imaging means, the first pressure generating means and the second pressure generating means, wherein the control unit controls the first drive source so that alignment between the first alignment mark and the substrate side mark is performed based on results of imaging these marks in the imaging means, the control unit controls driving of the first pressure generating means so as to retain the substrate by the first photomask by utilizing negative pressure after alignment between the substrate and the first photomask is performed by controlling the first drive source, the control unit controls the second drive source so that alignment between the second alignment mark and the third alignment mark is performed based on results of imaging these marks in the imaging means, and the control unit controls driving of the second pressure generating means so as to retain the substrate by the second photomask by utilizing negative pressure after alignment between the substrate and the second photomask is performed by controlling the second drive source.

2. An exposure apparatus for exposing both faces of a substrate wherein both the faces have a photosensitive material formed thereon, the exposure apparatus comprising:

a first photomask comprising a drawing pattern for exposure formed on one face, a first alignment mark for alignment with a substrate side mark formed on the substrate, the first alignment mark being provided in a region of the one face, the region opposing the substrate when the substrate is retained and the drawing pattern is not formed in the region, and a second alignment mark provided in a region which does not oppose the substrate when the substrate is retained;

a first moving mechanism comprising a first drive source and moving by driving the first drive source the first photomask disposed to oppose one face of the substrate at a position where exposure is performed;

a second photomask comprising a drawing pattern for exposure formed on one face, a third alignment mark for alignment with the second alignment mark, the third alignment mark being provided in a region of the one face wherein the region does not oppose the substrate when the substrate is retained;

a second moving mechanism comprising a second drive source and moving by driving the second drive source the second photomask disposed to oppose other face of the substrate at a position where exposure is performed;

an imaging means for imaging the first alignment mark and a substrate side mark formed on the substrate and imaging the second alignment mark and the third alignment mark;

a first pressure generating means for retaining the substrate by the first photomask by utilizing negative pressure or releasing retention of the substrate by the first photomask by utilizing positive pressure;

a second pressure generating means for retaining the substrate by the second photomask by utilizing negative pressure or releasing retention of the substrate by the second photomask by utilizing positive pressure; and a control unit for controlling driving of the first drive source, the second drive source, the imaging means, the first pressure generating means and the second pressure generating means, wherein the control unit controls the first drive source so that alignment between the first alignment mark and the substrate side mark is performed based on results of imaging these marks in the imaging means, the control unit controls driving of the first pressure generating means so as to retain the substrate by the first photomask by utilizing negative pressure after alignment between the substrate and the first photomask is performed by controlling the first drive source, the control unit controls the second drive source so that alignment between the second alignment mark and the third alignment mark is performed based on results of imaging these marks in the imaging means, and the control unit controls driving of the second pressure generating means so as to retain the substrate by the second photomask by utilizing negative pressure after alignment between the substrate and the second photomask is performed by controlling the second drive source.

* * * * *